(12) United States Patent
Ramirez et al.

(10) Patent No.: US 11,950,378 B2
(45) Date of Patent: Apr. 2, 2024

(54) VIA BOND ATTACHMENT

(71) Applicant: Harbor Electronics, Inc., Salt Lake City, UT (US)

(72) Inventors: Sergio Ramirez, Santa Clara, CA (US); Benjamin Norris, Santa Clara, CA (US); Paul Diehl, Santa Clara, CA (US); Chris Cuda, Santa Clara, CA (US)

( * ) Notice: Subject to any disclaimer, the term of this patent is extended or adjusted under 35 U.S.C. 154(b) by 0 days.

(21) Appl. No.: 17/401,810

(22) Filed: Aug. 13, 2021

(65) Prior Publication Data
US 2023/0053225 A1 Feb. 16, 2023

(51) Int. Cl.
*H05K 3/00* (2006.01)
*G01R 3/00* (2006.01)
*H01R 12/52* (2011.01)
*H05K 3/06* (2006.01)
*H05K 3/40* (2006.01)
*H05K 3/46* (2006.01)

(52) U.S. Cl.
CPC .............. *H05K 3/462* (2013.01); *G01R 3/00* (2013.01); *H01R 12/523* (2013.01); *H05K 3/0032* (2013.01); *H05K 3/4069* (2013.01); *H05K 3/4638* (2013.01); *H05K 2203/068* (2013.01); *H05K 2203/1131* (2013.01)

(58) Field of Classification Search
CPC ...... H05K 1/036; H05K 1/092; H05K 1/0298; H05K 1/0373; H05K 1/115; H05K 1/119; H05K 3/00; H05K 3/06; H05K 3/0032; H05K 3/462; H05K 3/467; H05K 3/4069; H05K 3/4602; H05K 3/4614; H05K 3/4617; H05K 3/4623; H05K 3/4638; H05K 3/4688; H05K 2203/061; H05K 2203/068; H05K 2203/1131; H05K 2203/1383; H05K 1/095; H05K 1/165; H05K 1/02; H05K 1/0206; H05K 1/0306; H05K 3/0073; H05K 3/281; H05K 3/4007; H05K 3/4611; H05K 3/4629; H05K 3/4691; G01R 3/00; H01R 12/523; H01F 17/0013
USPC .......... 361/803; 324/755.05, 755.07, 754.07, 324/756.03; 428/1.6, 209, 232, 325, 621; 174/250, 254, 255, 257, 258, 262, 252, 174/256; 29/830, 831, 846, 847
See application file for complete search history.

(56) References Cited

U.S. PATENT DOCUMENTS 4,726,480 A * 2/1988 Hagan .................. B29C 65/08
  215/311
5,370,759 A * 12/1994 Hakotani ............ H01L 21/4857
  156/289

(Continued)

*Primary Examiner* — Xiaoliang Chen
(74) *Attorney, Agent, or Firm* — Shapiro IP Law; Joseph Shapiro

(57) ABSTRACT

A method for attaching two electronics boards, e.g., a testing PCB and a space transformer, comprises rack welding resin prepreg and a mylar film to a testing PCB; laser drilling via holes in the resin prepreg and mylar film such that the holes are aligned on one side of the resin prepreg with connection/capture pads on the testing PCB and aligned (after attachment) on the other side of the resin prepreg with connection capture pads on a space transformer, filling the via holes with sintering paste; applying a pressure treatment to remove air, bubbles, and voids from the sintering paste; removing the mylar film; and using a lamination press cycle to attach a space transformer to the resin prepreg.

13 Claims, 4 Drawing Sheets

(56) References Cited

U.S. PATENT DOCUMENTS

| | | | | |
|---|---|---|---|---|
| 5,407,511 A * | 4/1995 | Nakatani | | H05K 3/4069 156/289 |
| 5,647,966 A * | 7/1997 | Uriu | | H05K 3/205 156/89.12 |
| 5,744,758 A * | 4/1998 | Takenouchi | | H05K 3/4069 428/209 |
| 5,972,482 A * | 10/1999 | Hatakeyama | | H05K 3/4069 428/209 |
| 6,096,411 A * | 8/2000 | Nakatani | | C08K 3/08 428/209 |
| 6,237,218 B1 * | 5/2001 | Ogawa | | H05K 3/4638 428/209 |
| 6,739,040 B1 * | 5/2004 | Nakamura | | H05K 3/4069 29/830 |
| 7,939,179 B2 * | 5/2011 | DeVos | | B32B 15/011 220/592.25 |
| 9,445,511 B2 * | 9/2016 | Kanda | | H05K 3/4069 |
| 2002/0045394 A1 * | 4/2002 | Noda | | B32B 27/04 442/180 |
| 2002/0178942 A1 * | 12/2002 | Takenaka | | H05K 3/1225 101/127.1 |
| 2003/0138553 A1 * | 7/2003 | Takenaka | | H05K 3/4069 427/97.8 |
| 2004/0135652 A1 * | 7/2004 | Uchida | | H01F 17/0013 333/185 |
| 2005/0016764 A1 * | 1/2005 | Echigo | | H05K 3/4691 29/830 |
| 2005/0046537 A1 * | 3/2005 | Hagios | | G01R 1/07378 336/223 |
| 2005/0066805 A1 * | 3/2005 | Park | | F41H 5/0435 89/36.02 |
| 2005/0129877 A1 * | 6/2005 | Akada | | G02F 1/133305 428/1.6 |
| 2005/0197020 A1 * | 9/2005 | Park | | F41H 5/0471 442/41 |
| 2006/0030226 A1 * | 2/2006 | Park | | F41H 5/0464 428/911 |
| 2006/0191133 A1 * | 8/2006 | Nakao | | H05K 3/4617 174/250 |
| 2007/0024297 A1 * | 2/2007 | Ismail | | G01R 3/00 324/755.05 |
| 2007/0024298 A1 * | 2/2007 | Khoo | | G01R 1/06727 324/755.07 |
| 2007/0108586 A1 * | 5/2007 | Uematsu | | H05K 3/4629 257/690 |
| 2008/0129629 A1 * | 6/2008 | Kimura | | H05K 1/165 343/788 |
| 2009/0051041 A1 * | 2/2009 | Otsuka | | H01L 23/49822 257/774 |
| 2009/0260858 A1 * | 10/2009 | Nakai | | H05K 1/0206 174/252 |
| 2010/0001748 A1 * | 1/2010 | Sasaki | | G01R 31/2889 324/754.07 |
| 2010/0219852 A1 * | 9/2010 | Yamada | | G01R 1/07371 324/756.03 |
| 2011/0124299 A1 * | 5/2011 | Koujima | | H01F 1/344 307/104 |
| 2011/0277655 A1 * | 11/2011 | Ko | | H01L 21/76898 101/483 |
| 2012/0325533 A1 * | 12/2012 | Yoshimura | | H05K 3/4623 174/258 |
| 2013/0020394 A1 * | 1/2013 | Koujima | | H01Q 7/00 343/788 |
| 2013/0126221 A1 * | 5/2013 | Kanda | | H05K 1/0298 156/182 |
| 2013/0153276 A1 * | 6/2013 | Kubo | | H05K 3/0073 156/247 |
| 2014/0176286 A1 * | 6/2014 | Okada | | H01F 17/0013 336/200 |
| 2014/0224532 A1 * | 8/2014 | Hashimoto | | H05K 3/4605 174/258 |
| 2015/0235753 A1 * | 8/2015 | Chatani | | H01F 41/046 336/200 |
| 2016/0145458 A1 * | 5/2016 | Walker, Jr. | | C09D 127/12 428/325 |
| 2016/0295707 A1 * | 10/2016 | Takano | | H05K 1/115 |
| 2016/0304682 A1 * | 10/2016 | Liu | | C08J 5/18 |
| 2017/0017733 A1 * | 1/2017 | Kuczynski | | G06F 30/23 |
| 2017/0122981 A1 * | 5/2017 | Nasu | | G01R 31/2889 |
| 2017/0283571 A1 * | 10/2017 | Taketa | | B32B 15/085 |
| 2019/0106194 A1 * | 4/2019 | Tajiri | | B32B 3/28 |
| 2021/0059058 A1 * | 2/2021 | Hsu | | H05K 3/4614 |
| 2021/0253813 A1 * | 8/2021 | Koshi | | B32B 5/28 |
| 2021/0276276 A1 * | 9/2021 | Tanaka | | C08L 71/00 |

* cited by examiner

VIA BOND ATTACHMENT

BACKGROUND OF THE INVENTION

In the current state of the art, a space transformer is connected to a testing PCB (or other PCB) through an interposer (spring contactor array), is mechanically bolted to the PCB, or is attached through direct solder attach. But these attachment/connection approaches suffer from significant drawbacks.

The interposer technique suffers from non-uniform planarity and high resistance-via-values.

Solder attach is done after PCB assembly-when expensive components are already on the board. Solder attach is difficult and prone to failure, and when it fails the expensive components may be damaged/destroyed and unusable. Also, planarity between the PCB and space transformer is difficult to insure. Additionally, solder attach does not allow for recess mounting to the PCT.

What is needed is improved method(s) for attaching a space transformer to a PCB.

BRIEF SUMMARY OF THE INVENTION

A method for attaching two electronics boards, e.g., a testing PCB and a space transformer, comprises tack welding resin prepreg and a mylar film to a testing PCB; laser drilling via holes in the resin prepreg and mylar film such that the holes are aligned on one side of the resin prepreg with connection/capture pads on the testing PCB and aligned (after attachment) on the other side of the resin prepreg with connection capture pads on a space transformer, filling the via holes with sintering paste; applying a pressure treatment to remove air, bubbles, and voids from the sintering paste; removing the mylar film; and using a lamination press cycle to attach a space transformer to the resin prepreg.

DETAILED DESCRIPTION OF THE INVENTION

A system and method are disclosed for mounting a space translator to a testing PCB.

Table of Reference Numbers from Drawings:

| Reference Number | Description |
| --- | --- |
| 105 | testing PCB |
| 110a-n | pads on testing PCB |
| 120 | resin prepreg |
| 130 | mylar layer/film |
| 140a-n | vias |
| 150 | sintering paste |
| 160 | space transformer |
| 170a-n | pads on space transformer |
| 900 | flowchart of exemplary method |
| 910 | step in flowchart |
| 920 | step in flowchart |
| 930 | step in flowchart |
| 940 | step in flowchart |
| 950 | step in flowchart |
| 960 | step in flowchart |
| 970 | step in flowchart |

The following table is for convenience only, and should not be construed to supersede any potentially inconsistent disclosure herein.

A process for attaching a space transformer to a testing PCB may comprise the process disclosed herein below.

In the disclosure herein, the abbreviation "mm" is used for millimeter.

Figure 9:
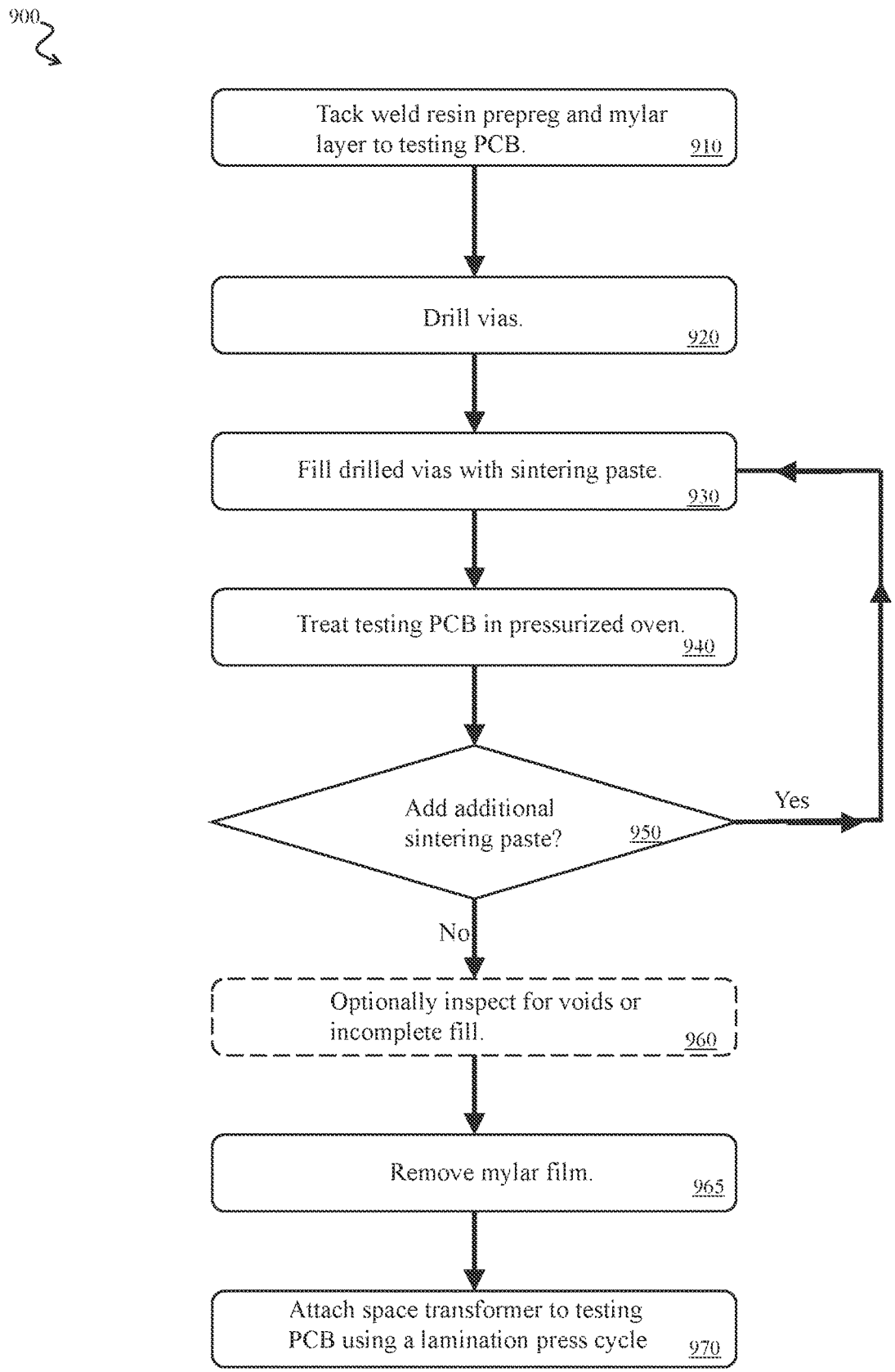
FIG. 9 shows a flowchart for an exemplary method for attaching a space transformer to a testing PCB.

FIG. 9 shows a flowchart for an exemplary method for attaching a space transformer to a testing PCB.

At step 910, resin prepreg and a mylar layer/film may be tack welded to the testing PCB.

Figure 1:
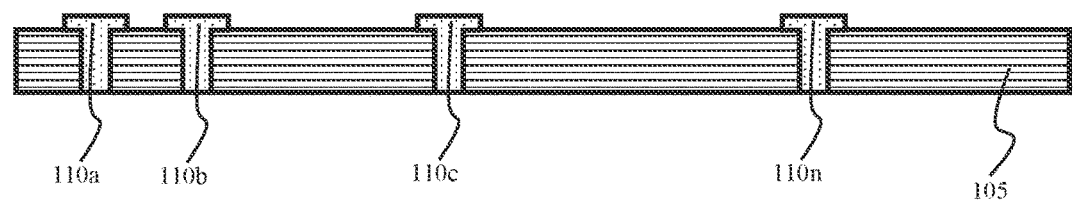
FIG. 1 shows an exemplary testing PCB.

FIG. 1 shows a testing PCB, including pads 110a-n. In one embodiment, the resin prepreg may be uncured epoxy with glass weave, e.g., FR4 material prepreg. In some embodiments, a different prepreg could be used, e.g., a prepreg from Rogers Corporation. The prepreg thickness and resin content in the prepreg may be significant parameters. Using a prepreg with too great of a resin content increases the potential for failure because resin may flow in the press cycle (described below). When too much resin flows, the resin may move/flow and throw off or misaligns the sintering paste. In one embodiment, 70% resin content by weight with a single ply of 1067 prepreg (2.5 mm thick) provides a good thickness and sufficient, but not too much, resin content.

The benefit of thinner prepreg may be that it is easier to fill with sintering paste as described herein below.

Figure 2:
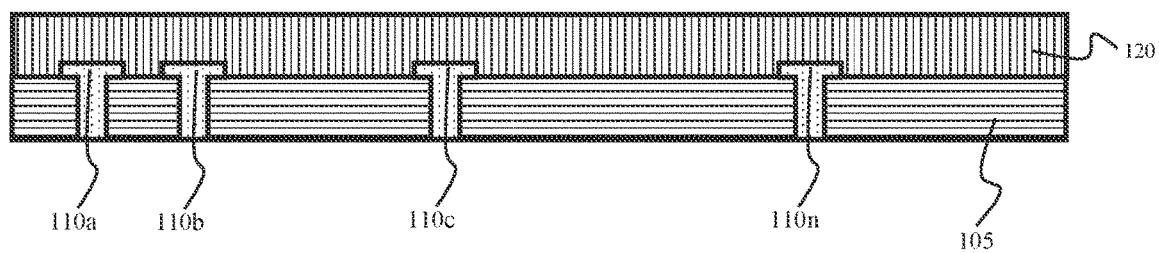
FIG. 2 shows resin prepreg attached to a testing PCB.

FIG. 2 shows resin prepreg 120 tack welded to testing PCB 105.

Figure 3:
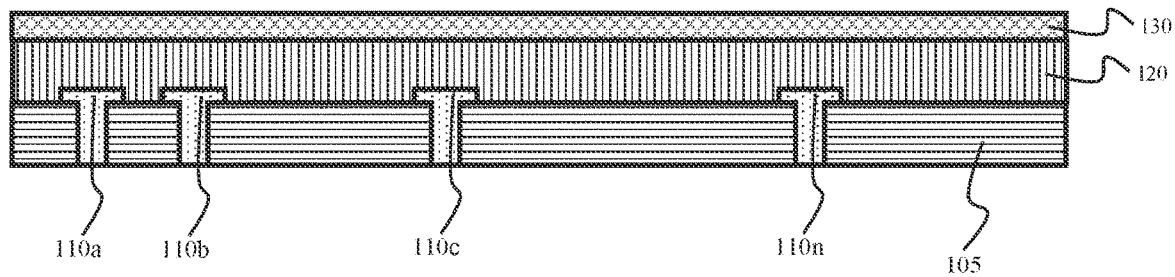
FIG. 3 shows resin prepreg and mylar film attached to a testing PCB.

As shown in FIG. 3, a sheet/layer/film of mylar 130 may be applied on top of the prepreg, e.g., by tack welding. The mylar layer may prevent sintering paste (described herein below) from smearing on the prepreg. In one embodiment, a 1 mm mylar sheet/film may be used. Increasing mylar thickness may result in failure because thicker mylar results in increased sintering paste after mylar removal, thereby resulting in shorts. In general, a film or layer may be necessary to prevent smearing of the sintering paste, and in one embodiment this may be a mylar film.

In one embodiment, prepreg 120 and mylar film 130 may be tack-welded to testing PCB 105 using a mylar bag and a vacuum laminator at 225 degrees Fahrenheit. As is understood in the art, other materials, temperatures, and or procedures may be used for tack welding or attaching prepreg 120 and mylar 130 to testing PCB 105.

Figure 4:
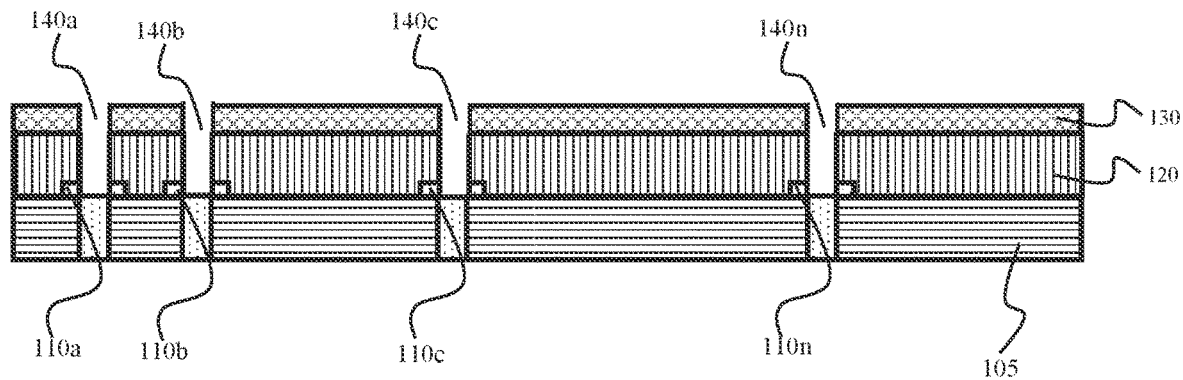
FIG. 4 shows via holes through prepreg and mylar film attached to a testing PCB.

As shown in FIG. 4, at step 920, vias 140a-n may be laser drilled through resin prepreg layer 120 and mylar layer 130 at locations for electrical connections between the testing PCB and the space transformer. In one embodiment, vias 140*a-n* may be laser drilled using a FR4 laser drill recipe. The diameter of the laser drilled hole may be 6 mil for an 8 mil-diameter capture pad. In general, the diameter of the laser drill is smaller than the diameter of capture pads 110*a-n* to make sure the laser drill does not "fall off" the capture pad.

Figure 5:
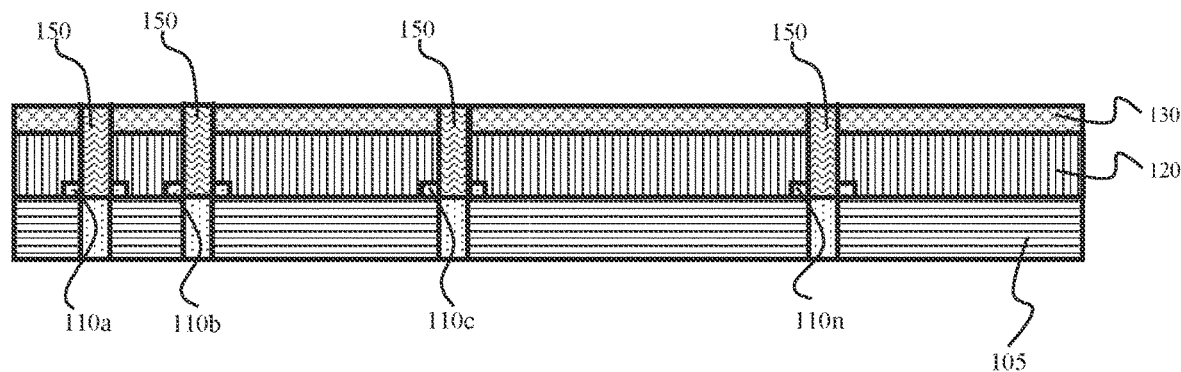
FIG. 5 shows via holes filled with sintering paste.

As shown in FIG. 5, at step 930 drilled holes/vias 140*a-n* may be filled with sintering paste 150. In one embodiment, sintering paste 150 may be applied by screen table printing using a squeegee application. In general, many different sintering pastes may be used and may be applied in various ways as known in the art.

At step 940, the testing PCB (with resin prepreg, drilled holes, and sintering paste in the drilled holes) is treated in a pressurized oven to remove air pockets from the via holes. Although a pressurized oven may be used, the heat may not be necessary. The pressure may by itself (i.e., without heat) remove air pockets from the bottoms of the via holes. In one embodiment. 8-bar pressure may be used. Additionally, the pressure may compress the sintering paste to the pad.

In one embodiment, the pressure oven (although the temperature feature of the oven is not used) may be a pressure/vacuum oven. A 30-minute cycle may be used for a vacuum cycle and a pressure cycle. The vacuum cycle may be 5 minutes. The pressure cycle may be 8-bar pressure for 20 minutes. The cycle may complete with 5 minutes to de-gas the chamber. The vacuum cycle may suck air and gasses out of the chamber, including sucking air and bubbles from the sintering paste. The pressure/compression cycle may compress the sintering pate and push air out of the sintering paste.

In one embodiment, the pressurized oven is run at 8-bar pressure for 20 minutes.

Other parameters may be used as long as the air pockets are removed from the via holes or substantially removed from the via holes. At step 950, a determination may be made regarding optionally adding additional sintering paste to the laser-drilled holes to ensure that the holes are sufficiently filled. This additional filling with sintering paste is necessary only if the holes are not sufficiently filled. If it is determined to add additional sintering paste, processing returns to step 930 for adding sintering paste and treating in a pressurized oven at step 940.

If at step 950 it is determined to not add additional sintering paste, at step 960 the testing PCB may optionally be inspected for voids and/or incomplete fill. If void, incomplete fill, and/or other problems are discovered, then steps 130-160 may be repeated.

Figure 6:
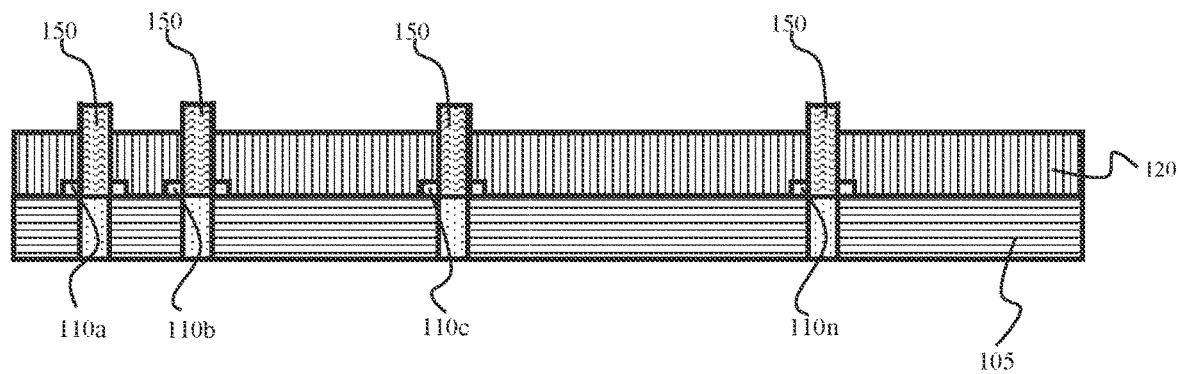
FIG. 6 shows the testing PCB after removal of the mylar film.

As shown in FIG. 6, at step 965, mylar film 130 may be removed. In one embodiment, mylar film 130 may be removed by heating to approximately 160 degrees Fahrenheit in, e.g., a conventional oven. After heating, mylar film 130 may be removed by carefully pulling it away from the resin prepreg. It may be beneficial to carefully pull with two hands, being careful to not remove sintering paste from the vias. Depending on the characteristics of the particular mylar or other film used, specific removal parameters or procedures may vary.

Figure 7:
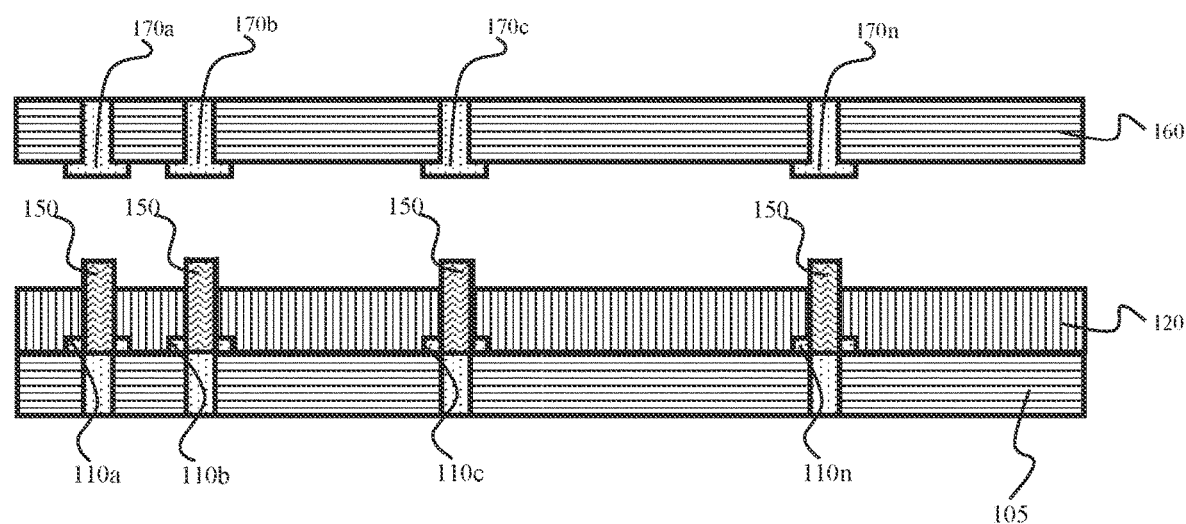
FIG. 7 shows the testing PCB (including resin prepreg, mylar film, and holes filled with sintering paste) before attachment to the space transformer.
Figure 8:
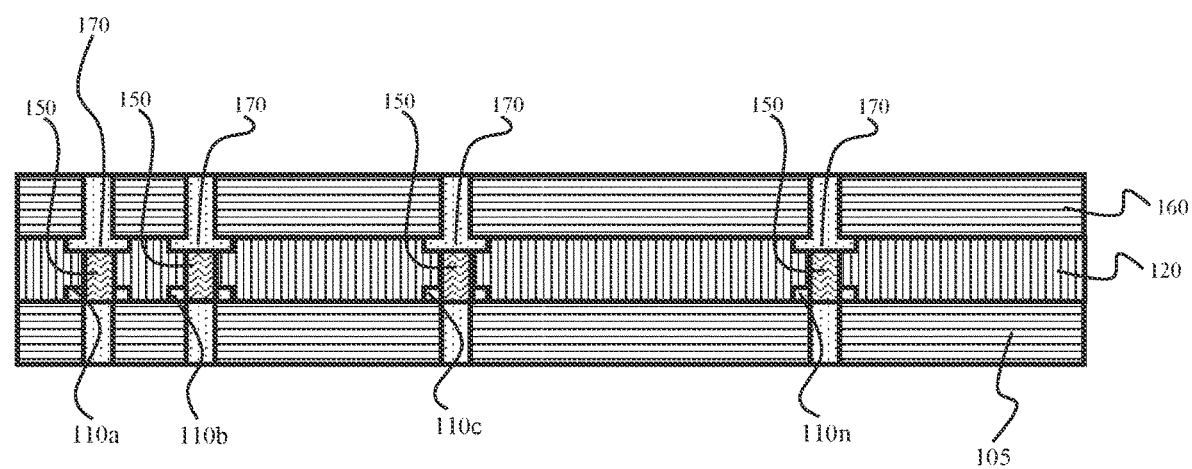
FIG. 8 shows the testing PCB (including resin prepreg, mylar film, and holes filled with sintering paste) after attachment to the space transformer.

At step 970, space transformer 160 is attached to testing PCB 105 using a lamination press cycle. FIG. 7 shows space transformer 160 (including pads 170*a-n*), testing PCB 105, resin prepreg layer 120, and sintering paste 150 before the lamination press cycle. FIG. 8 shows the components and layers after the lamination press cycle.

The lamination press cycle cures prepreg 120 and sintering paste 150. Many lamination press technologies, methods, and/or tools are known in the art. In general, a lamination press cycle uses a combination of pressure and temperature. In one embodiment, the pressure may be set at 450 psi and the temperature ramp-up pattern may be, in degrees Fahrenheit, 180, 195, 300, 365, with the temperature remaining at 365 degrees Fahrenheit for 240 minutes. In general, a person of ordinary skill in the art will be able to adjust, modify, and or tune the parameters for the lamination press cycle. Additionally, the particular prepreg that is used may have specific lamination cycle parameters.

The attachment method described herein may have several benefits. One benefit is that the attachment may occur during the PCB manufacturing process, thereby avoiding damage to components that may be on the PCB after completion of some or all of PCB manufacturing. Another advantage is that the space transformer may be attached to the PCB so that the space transformer is recessed relative to the PCB surface, and possibly flush with the PCB surface.

Although this disclosure focuses on attaching a space transformer to a PCB, the methods. techniques, technologies, and innovations disclosed herein apply similarly to attaching a PCB to a PCB, or attaching a space transformer to a space transformer.

What is claimed is:

1. A method for attaching a testing PCB to a space transformer, comprising:
   fabricating a testing PCB;
   fabricating a space transformer; and
   prior to attaching a component to the testing PCB that would be damaged by a lamination press;
      securing resin prepreg to an attachment side of the testing PCB;
      fabricating a hole through the resign prepreg at a location of an electrical connection on the testing PCB;
      filling the hole with sintering paste;
      pressure treating the testing PCB (along with the resin prepreg and sintering paste);
      using a lamination press cycle to attach an attachment side of the space transformer to the side of the resin prepreg opposite the testing PCB such that an electrical connection on the space transformer is aligned with the sintering paste in the hole.

2. The method of claim 1, further comprising:
   after securing the resin prepreg, and before fabricating the hole, applying a mylar layer to the resin prepreg opposite the testing PCB; and
   after pressure treating, and before using the lamination press cycle, removing the mylar layer from the resin prepreg.

3. The method of claim 2, wherein the mylar layer comprises a mylar sheet that is approximately 1 mm thick.

4. The method of claim 1, wherein securing the resin prepreg to an attachment side of the testing PCB comprises tack welding the resin prepreg to the attachment side of the testing PCB.

5. The method of claim 1, wherein fabricating a hole comprises laser drilling a hole.

6. The method of claim 5, wherein fabricating a hole comprises laser drilling a hole that is approximately 6 mil diameter.

7. The method of claim 1, wherein pressure treating the first electronics board comprises a vacuum cycle and pressure cycle.

8. The method of claim 7, wherein the pressure cycle is approximately 8-bar pressure for approximately 20 minutes.

9. The method of claim 1, further comprising, after pressure treating and before using a lamination press cycle:
   adding additional sintering paste to the hole; and
   pressure treating the testing PCB (along with the resin prepreg and sintering paste).

10. The method of claim 9, further comprising, prior to adding additional sintering paste to the hole, determining that the hole is not sufficiently filled with sintering paste.

11. The method of claim 1, wherein the resin prepreg is uncured epoxy with glass weave.

12. The method of claim 1, wherein the resin prepreg is approximately 2.5 mil thick and is approximately 70% resin content by weight.

13. The method of claim 1, wherein pressure treating comprises using a pressure/vacuum oven.

* * * * *